United States Patent [19]
Iwamatsu et al.

[11] Patent Number: 6,096,583
[45] Date of Patent: Aug. 1, 2000

[54] SEMICONDUCTOR DEVICE AND MANUFACTURING METHOD THEREOF

[75] Inventors: Toshiaki Iwamatsu; Takashi Ipposhi; Yasuo Inoue, all of Tokyo, Japan

[73] Assignee: Mitsubishi Denki Kabushiki Kaisha, Tokyo, Japan

[21] Appl. No.: 09/133,690

[22] Filed: Aug. 12, 1998

Related U.S. Application Data

[62] Division of application No. 08/746,951, Nov. 18, 1996, Pat. No. 5,841,171.

[30] Foreign Application Priority Data

May 8, 1996 [JP] Japan .................................... 8-113854

[51] Int. Cl.⁷ .................................................. H01L 21/70
[52] U.S. Cl. ......................... 438/149; 438/154; 438/164; 438/165; 438/439; 438/443; 438/452
[58] Field of Search ................................. 438/149, 153, 438/154, 164, 165, 439, 443, 452, 479

[56] References Cited

U.S. PATENT DOCUMENTS

| | | | |
|---|---|---|---|
| 4,889,829 | 12/1989 | Kawai ..................... | 438/154 |
| 4,997,786 | 3/1991 | Kubota et al. . | |
| 5,139,964 | 8/1992 | Onishi et al. ............. | 438/452 |
| 5,166,082 | 11/1992 | Nakamura et al. ...... | 438/154 |
| 5,315,132 | 5/1994 | Yamazaki . | |
| 5,466,630 | 11/1995 | Lur . | |
| 5,514,879 | 5/1996 | Yamazaki . | |
| 5,517,047 | 5/1996 | Linn et al. . | |
| 5,543,343 | 8/1996 | Bryant ..................... | 438/452 |
| 5,547,886 | 8/1996 | Harada ..................... | 438/149 |
| 5,646,052 | 7/1997 | Lee ........................... | 436/439 |
| 5,801,081 | 9/1998 | Warashina et al. ....... | 438/410 |

FOREIGN PATENT DOCUMENTS

| | | |
|---|---|---|
| 2-304927 | 12/1990 | Japan . |
| 3-263852 | 11/1991 | Japan . |
| 4-067649 | 3/1992 | Japan . |
| 5-144805 | 6/1993 | Japan . |
| 5-160120 | 6/1993 | Japan . |
| 5-259418 | 10/1993 | Japan . |

OTHER PUBLICATIONS

Terukazu Ohno et al., "Experimental 0.25–$\mu$m–Gate Fully Depleted CMOS/SIMOX Process Using a New Two–Step LOCOS Isolation Technique", vol. 42, No. 8, Aug. 1995.

*Primary Examiner*—Mary Wilczewski
*Assistant Examiner*—Yung A. Lin
*Attorney, Agent, or Firm*—McDermott, Will & Emery

[57] ABSTRACT

In forming an element isolating region in a silicon semiconductor layer of an SOI substrate, a silicon nitride film of a predetermined thickness is deposited over an oxide film formed on a SOI layer. The silicon nitride film is patterned in a design size of active regions, and side walls of a silicon nitride film are formed on the side surfaces of the patterned silicon nitride film. A first LOCOS process is carried out using the nitride film as an oxidation mask. A LOCOS film formed by the first LOCOS process is removed to form narrower concavities under the side walls. Then, another silicon nitride film is deposited, and is removed leaving portions thereof forming the concavities. Then, a second LOCOS process is carried out to form a LOCOS film as an element isolating region. The second LOCOS process uses the oxidation mask having the narrow cavities, so that stress at the boundary of the active region and the element isolation region is reduced, and the growth of bird's beaks can be suppressed.

11 Claims, 12 Drawing Sheets

SEMICONDUCTOR DEVICE AND MANUFACTURING METHOD THEREOF

This application is a division of application Ser. No. 08/746,951 filed Nov. 18, 1996, now U.S. Pat. No. 5,841,171.

TECHNICAL FIELD

The present invention relates to a semiconductor device formed on a SOI (silicon on insulator or semiconductor on insulator) wafer or a semiconductor wafer, and a method of manufacturing such a semiconductor device.

BACKGROUND ART

FIG. 35 is a sectional view of a conventional semiconductor device disclosed in IEEE Transactions on Electron Devices, Vol. 42, No. 8 (August 1995).

Referring to FIG. 35, the semiconductor device includes a silicon wafer 101, a buried oxide film 102 formed on the silicon wafer 101, active regions 103a and 103b formed on the buried oxide film 102, and an element isolating region 104 for electrically isolating a plurality of active regions formed on the buried oxide film 102 from each other. The element isolating region 104 is formed by locally oxidizing a SOI layer formed on the buried oxide film 102, which will be described later.

Shown also in FIG. 35 are a gate insulating film 105 formed on the active regions 103a and 103b, a gate electrode 106a containing a p-type impurity and formed over the active region 103a, a gate electrode 106b containing an n-type impurity and formed on the active region 103b, a silicon nitride film 107 covering the gate electrodes 106a and 106b and the element isolating region 104, an interlayer insulating film 108a deposited on the silicon nitride film 107, through holes 109 for electrically connecting the active regions 103a and 103b to first metal conductive leads 110 formed on the interlayer insulating film 108a, an interlayer insulating film 108b formed over the first metal conductive leads 110, through holes 111 for electrically connecting the first metal conductive leads 110 to second metal conductive leads 112 formed on the interlayer insulating film 108b, and a silicon nitride film 113 covering the second metal conductive leads 112.

The active regions 103a and 103b form source/drain regions and channel regions for a p-channel transistor and an n-channel transistor, respectively.

A method of manufacturing the semiconductor device of FIG. 35 will be described hereinafter.

First, as shown in FIG. 36, a silicon nitride film 115 of a predetermined pattern is formed on a SOI wafer which is formed by sequentially depositing the buried oxide film 102 and a SOI layer 114 in that order on the silicon wafer 101. The silicon nitride film 115 has portions extending over regions corresponding to the active regions 103a and 103b and having dimensions corresponding to the design dimensions of the active regions.

Then as shown in FIG. 37, the surface of the SOI layer 114 is oxidized by thermal oxidation using the silicon nitride film 115 as an oxidation mask to form a first LOCOS film 116.

Then, as shown in FIG. 38, portions of the first LOCOS film 116 are removed selectively by wet etching to form a groove 114a in a region of the SOI layer 114 corresponding to an element isolating region.

Then, as shown in FIG. 39, a silicon nitride film 116 is deposited on the side surfaces of the groove 114a.

Then, as shown in FIG. 40, a portion of the surface of the SOI layer 114 forming the bottom surface of the groove 114a is oxidized by thermal oxidation to form a second LOCOS film, i.e., an element isolating region 104. Since a portion of the SOI layer 114 under the groove 114a is oxidized completely, the bottom of the element isolating region 104 is in contact with the upper surface of the buried oxide film 102. The active regions 103a and 103b of the SOI layer 114 are electrically isolated from each other by the element isolating region 104.

Then, the silicon nitride films 115 and 116 used as oxidation masks are removed selectively, and the gate insulating film 105 is formed over the surfaces of the active regions 103a and 103b.

Then, as shown in FIG. 41, polycrystalline silicon films respectively containing a p-type impurity and an n-type impurity are deposited on the gate insulating film 105 over the active regions 103a and 103b, respectively, and the polycrystalline silicon films are patterned to form the gate electrodes 106a and 106b of transistors.

Then, as shown in FIG. 42, source/drain regions are formed in the active regions 103a and 103b by ion implantation, and the entire surface of this structure is covered with a silicon nitride film 107 of a predetermined thickness. Then, side walls 117 of polycrystalline silicon containing an n-type impurity are formed over the side surfaces of the gate electrodes 106a and 106b.

Then, as shown in FIG. 43, the interlayer insulating film 108a and the through holes 109 are formed.

Then, as shown in FIG. 35, the first metal conductive leads 110 are formed on the interlayer insulating film 108a, and the interlayer insulating film 108b is formed over the entire surface of this structure. Then, through holes 111 are formed so as to correspond to the first metal conductive leads 110, and the second metal conductive leads 112 are formed on the second interlayer insulating film 108b so as to be electrically connected to the through holes 111 to complete the semiconductor device shown in FIG. 35.

Thus, the SOI layer 114 is subjected to LOCOS processing twice when manufacturing the conventional semiconductor device to form the electrically isolated active regions 103a and 103b in the SOI layer 114.

The first LOCOS process forms the first LOCOS film 116 of an ordinary type using the silicon nitride film 115 as a mask as shown in FIG. 37. When the oxidation mask has a pattern of a size equal to the design size of the active regions 103a and 103b, bird's beaks are formed due to the lateral oxidation of the active regions 103a and 103b and, consequently, the effective size of the active regions 103a and 103b in a final state are smaller than the design size.

The silicon nitride film 116 is formed as an oxidation mask on the side surfaces of the groove 114a for the second LOCOS process shown in FIG. 39. Thus, bird's beak encroachment is suppressed when forming the LOCOS film 104.

In the conventional technique as stated above, bird's beaks formed when the ordinary LOCOS film is formed by the first LOCOS process are reflected on the final LOCOS film 104. Consequently, the active regions 103a and 103b for forming transistors have portions affected by bird's beaks, and the effective channel width is smaller than the design channel width.

The prior art technique forms the silicon nitride film 115 as the oxidation mask in contact with the surface of the SOI layer 114, forming the LOCOS film 116 by the first LOCOS process as shown in FIG. 37. However, defects are liable to develop in the crystal structure in the subsequent oxidation process, wherein the LOCOS process is carried out with the SOI layer in contact with the silicon nitride film.

The silicon nitride film 116 is formed so as to cover the side surfaces of the groove 114a formed in the SOI layer 114 as the oxidation mask for the second LOCOS process as shown in FIG. 39. Hence, portions of the oxidation mask corresponding to the edges of the silicon oxide film 115 of a uniform thickness, to which the edges of the silicon nitride film 116 are joined, has an increased thickness, so that the growth of bird's beaks can be suppressed. However, a comparatively high stress is induced in portions of the SOI layer near the silicon nitride film 116 causing defects to develop in the crystal structure, which causes the leakage of currents from the transistors.

DISCLOSURE OF THE INVENTION

The present invention solves these problems and it is therefore an object of the present invention to provide a semiconductor device of a large-scale integration by forming an element isolating region (LOCOS film) on a SOI wafer or a silicon wafer in a shape effective in suppressing bird's beak encroachment to suppress the reduction of effective active regions.

Another object of the present invention is to provide a structure capable of suppressing current leakage by forming a silicon nitride film so as not to be in direct contact with a SOI layer in a process of manufacturing a semiconductor device to suppress the development of defects in the crystal structure in the subsequent oxidation process.

A further object of the present invention is to provide a semiconductor device of a structure that keeps parasitic transistors formed in the vicinity of the interfaces between an element isolating region and active regions in an off state.

A still further object of the present invention is to improve the characteristics of transistors through the improvement of the condition of the interfaces between active regions and element isolating region, and between the active regions and a buried oxide film, when the element isolating region is formed on a SOI wafer, or the condition of the interfaces between active regions and an element isolating region, when the element isolating region is formed on a silicon wafer.

According to one aspect of the present invention, a semiconductor device comprises a silicon wafer, and a buried oxide film formed on said silicon wafer. A semiconductor active region is formed on said buried oxide film, and an element isolating region is formed contiguous with said active region on said buried oxide film. Further, nitrogen is accumulated at interfaces between said active region and said element isolating region and/or at interfaces between said active region and said buried oxide film.

According to another aspect of the present invention, a semiconductor device comprises a silicon wafer, and a semiconductor active region is formed on a major surface of said silicon wafer. An element isolating region contiguous with said semiconductor active region is formed on said major surface of said silicon wafer. Nitrogen is accumulated at interfaces between said semiconductor active region and said element isolating region.

According to another aspect of the present invention, in a manufacturing method of a semiconductor device, a first silicon nitride film is formed on a first oxide film which is formed on one major surface of a SOI wafer. The SOI wafer is formed by forming a SOI layer on a buried oxide film which is formed on a silicon wafer. A portion of said first silicon nitride film on an active region in said SOI layer has a predetermined thickness, and a portion of said first silicon nitride film extending outward from an edge of said active regions decreases in thickness as it extends outwardly from said edge of said active region.

Then, said first silicon nitride film is patterned. A first LOCOS film is formed using the first silicon nitride film as an oxidation mask. A concavity is formed between an edge of the first silicon nitride film and the SOI layer by selectively removing the first LOCOS film. A second oxide film is formed on the surface of the SOI layer. A second silicon nitride film is formed over the entire surface of the SOI wafer including the surface of the concavity. The second silicon nitride film is removed by anisotropic etching leaving a portion of the second silicon nitride film formed on the surface of the concavity. A second LOCOS film is formed using the first and the second silicon nitride film as an oxidation mask. The first and the second silicon nitride film is removed.

In another aspect of the present invention, in the manufacturing method of a semiconductor device, a bottom portion of the second LOCOS film is formed in contact with the buried oxide film.

In another aspect of the present invention, in the manufacturing method of a semiconductor device, nitrogen is implanted into a region of the SOI layer where an element isolating region is formed prior to said step of forming a second LOCOS film. Then, the nitrogen is caused to accumulate at interfaces between the element isolating region of the second LOCOS film and the active region or at interfaces between the active region and the buried oxide film by heating in the step of forming a second LOCOS film.

In another aspect of the present invention, in the manufacturing method of a semiconductor device, impurity ions are rotationally implanted to form a doped region of a high impurity density in the vicinity of the interfaces between the element isolating region and the active region after the step of forming the second LOCOS film.

In another aspect of the present invention, in the manufacturing method of a semiconductor device, the step of forming the first silicon nitride film is performed as follows. First, a silicon nitride film having a predetermined thickness is formed over the active region with end surfaces thereof perpendicular to one major surface of the SOI wafer on the edge of the active region. An oxide film is formed on a major surface of the SOI wafer in a region corresponding to an element isolating region. Further, a silicon nitride side wall is formed on the end surface of the silicon nitride film.

In another aspect of the present invention, in the manufacturing method of a semiconductor device, the step of forming the first silicon nitride film is performed as follows. First, a silicon nitride film of a predetermined thickness is formed on one major surface of the SOI wafer. An etching mask is formed on the silicon nitride film over the region corresponding to the active region. Further, the silicon nitride film is etched by taper etching using the etching mask so that the end surface of the silicon nitride film slopes at a predetermined inclination to one major surface of the SOI wafer.

According to another aspect of the present invention, in a manufacturing method of a semiconductor device, a first silicon nitride film is formed on a first oxide film which is formed on one major surface of a silicon wafer. A portion of the first silicon nitride film covering an active region in the silicon wafer has a predetermined thickness, and a portion of the first silicon nitride film extending outward from an edge of the active region has a thickness which decreases as it extends outwardly from the edge of the active region.

Then, the first silicon nitride film is patterned. A first LOCOS film is formed using the first silicon nitride film as an oxidation mask. A concavity is formed between an edge of the first silicon nitride film and the silicon wafer by selectively removing the first LOCOS film. A second oxide film is formed on the surface of the silicon wafer. A second silicon nitride film is formed over the entire surface of the silicon wafer including the surface of the concavity. The second silicon nitride film is removed by anisotropic etching leaving a portion of the second silicon nitride film formed on the surface of the concavity. A second LOCOS film is formed using the first and the second silicon nitride film as an oxidation mask. Further, the first and the second silicon nitride film is removed.

In another aspect of the present invention, in the manufacturing method of a semiconductor device, nitrogen is implanted, prior to said step of forming a second LOCOS film, into a region of the semiconductor layer where an element isolating region is formed. Then, the nitrogen is caused to accumulate at least at the interface between the element isolating region of the second LOCOS film and the active region by heating in the step of forming a second LOCOS film.

In another aspect of the present invention, in the manufacturing method of a semiconductor device, impurity ions are rotationally implanted to form a doped region of a high impurity density in the vicinity of the interface between the element isolating region and the active region after the step of forming the second LOCOS film.

In another aspect of the present invention, in the manufacturing method of a semiconductor device, the step of forming the first silicon nitride film is performed as follows. First, a silicon nitride film having a predetermined thickness is formed over the active region with an end surface thereof perpendicular to one major surface of the silicon wafer on the edge of the active region. An oxide film is formed on a major surface of the silicon wafer in a region corresponding to an element isolating region. Then, a silicon nitride side wall is formed on the end surface of the silicon nitride film.

In another aspect of the present invention, in the manufacturing method of a semiconductor device, the step of forming the first silicon nitride film is performed as follows. First, a silicon nitride film of a predetermined thickness is formed on one major surface of the silicon wafer. An etching mask is formed on the silicon nitride film over the region corresponding to the active region. Then, the silicon nitride film is etched by taper etching using the etching mask so that the end surface of the silicon nitride film slopes at a predetermined inclination to the major surface of the silicon wafer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

BEST MODE FOR CARRYING OUT THE INVENTION

Figure 1:
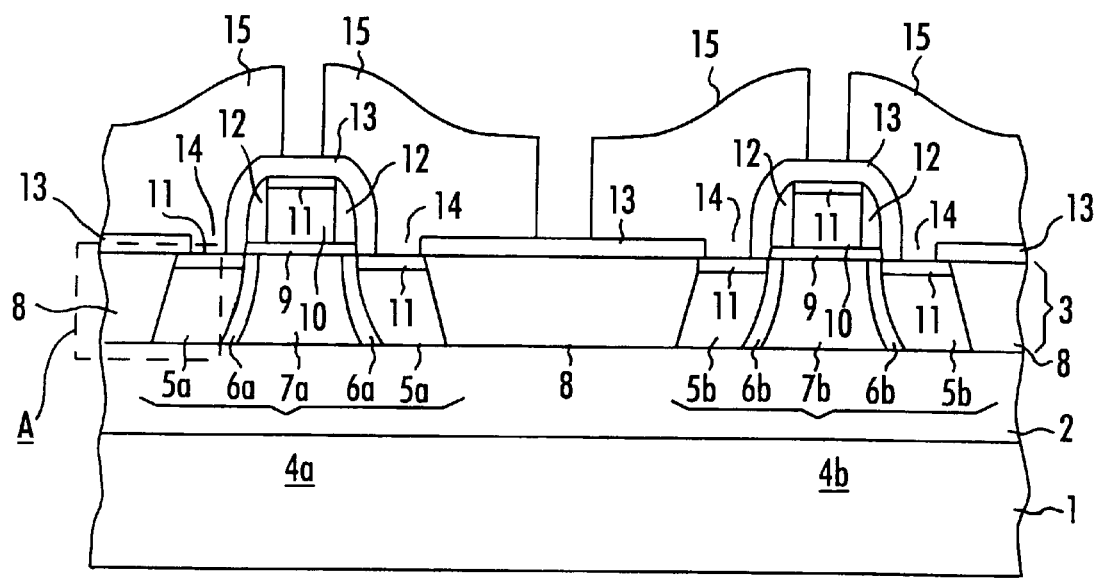
FIG. 1 shows a sectional view of a semiconductor device taken on line along the length of the gates of transistors in a first embodiment according to the present invention.

Referring now to the drawings, wherein like reference numerals designate identical or corresponding parts throughout the several views, first through fifth embodiments of the present invention are next described.

First Embodiment

FIG. 1 shows a sectional view of a semiconductor device taken on line along the length of the gates of transistors in a first embodiment according to the present invention.

Referring to FIG. 1, the semiconductor device includes a silicon wafer 1, a buried oxide film 2 formed on the silicon wafer 1, and a SOI layer 3 formed on the buried oxide film 2. The silicon wafer 1, the buried oxide film 2 and the SOI layer 3 constitute a SOI wafer.

The SOI wafer may be formed by a SIMOX method, which forms the buried oxide film 2 of a predetermined depth on one major surface of the silicon wafer 1 by oxygen implantation, by a lamination method or any suitable method. The silicon wafer 1 may be substituted by some other insulating semiconductor wafer.

Active regions 4a and 4b are formed in the SOI layer 3, and comprises heavily doped regions 5a and 5b, and lightly doped regions 6a and 6b for the source/drain regions, and channel regions 7a and 7b, respectively for an LDD construction of n-channel and p-channel transistors.

The plurality of active regions 4a and 4b are electrically isolated from each other by an element isolating region 8.

A gate insulating film 9 overlies the channel regions 7a and 7b, and gate electrodes 10 are formed on the gate insulating film 9. A titanium silicide layer 11 overlies the heavily doped regions 5a and 5b of the source/drain regions and the gate electrodes 10. The titanium silicide layer 11 also covers the side surfaces of the gate electrodes 10 to form side walls 12. Contact holes 14 reaching to the titanium silicide film 11 are formed in a interlayer insulating film 13, which covers the surface of thus formed structure, at positions corresponding to the source/drain regions. Metal conductive leads 15 are formed over the interlayer insulating film 13 so as to be connected through the contact holes 14 to the source/drain regions, respectively.

A method of manufacturing the semiconductor device of FIG. 1 will be described hereinafter. The present invention is pertinent particularly to the element isolating region 8, hence the method of manufacturing the semiconductor device will be described with focus on a method of forming the element isolating region 8 in connection with a portion A in FIG. 1 including the interface between the active region 4a and the element isolating region 8. Semiconductor elements to be formed on the active regions 4a and 4b can be manufactured by conventional techniques.

Figure 2:
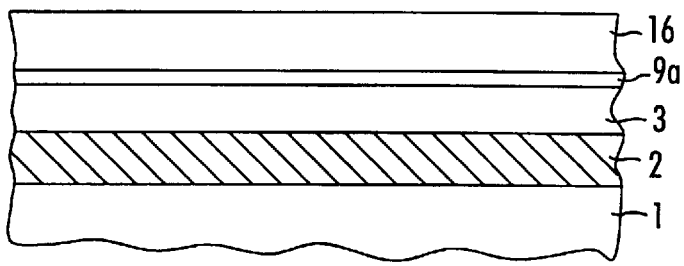
FIG. 2 through FIG. 10 illustrate a method of manufacturing a semiconductor device according to a first embodiment of the present invention.

Referring to FIG. 2, a silicon dioxide film 9a of a thickness in the range of 100 to 300 Å is formed by oxidation or CVD on the surface of the SOI wafer, which is created by forming the buried oxide film 2 on the silicon wafer 1, and forming the SOI layer 3 of silicon on the buried oxide film 2. A silicon nitride film (SiN) 16 of a thickness in the range of 1000 to 2000 Å is deposited by CVD on the silicon dioxide film 9a.

Figure 3:
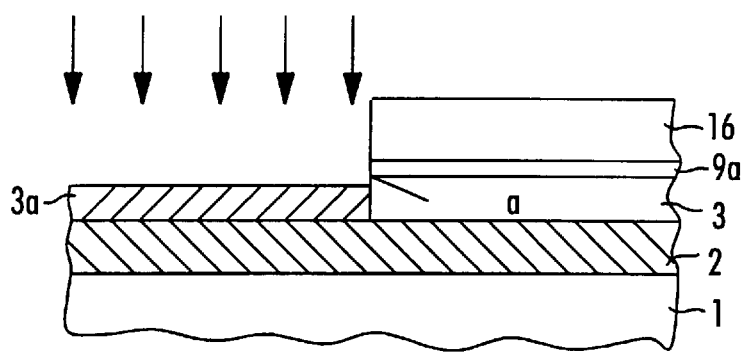

Then, as shown in FIG. 3, the silicon nitride film 16 and the gate insulating film 9 are patterned in the shape of the active region 4a so that the side surface of the silicon nitride film 16 is perpendicular. Then, boron (B) ions of 20 keV are implanted in a region corresponding to the element isolating region 8 in a dose in the range of $1 \times 10^{13}$ to $8 \times 10^{13}$ ions/cm$^2$ for channel stop to form the doped region 3a in the SOI layer 3.

Boron fluoride (BF2) may be used as an impurity instead of boron. When patterning the silicon nitride film 16, the surface of the SOI layer 3 is over-etched so that a step 'd' is formed between a portion of the surface of the SOI layer 3 underlying the silicon nitride film 16 and a portion of the surface of the SOI layer from which the silicon nitride film 16 is removed, i.e., the surface of the doped region 3a.

The type of the impurity to be implanted in the element isolating region is dependent on the type of conduction of the adjacent active region. When an n-channel transistor and a p-channel transistor are formed in the active regions 4a and 4b, respectively, impurities of the opposite type of conduction are used.

Figure 4:
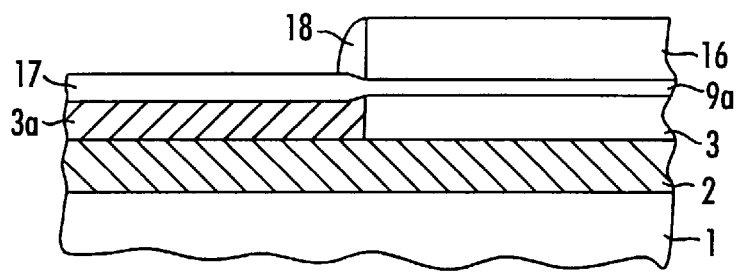

Then, as shown in FIG. 4, an exposed portion of the surface of the SOI layer 3 is oxidized to form a silicon dioxide film 17 of a thickness in the range of 10 to 300 Å, and then a side wall 18b of a silicon nitride film is formed over the side surface of the silicon nitride film 16. Consequently, under the side wall 18, the shoulder of the step d between the SOI layer 3 and the doped region 3a, is rounded, and the surface is leveled to improve the characteristics of a semiconductor element, such as a transistor, to be formed.

At this stage, there is formed an oxidation mask consisting of the silicon nitride film 16 patterned in the design size of the active regions 4a and 4b, and the side walls 18 gradually decrease in thickness from portions thereof corresponding to the edges of the active regions 4a and 4b toward portions thereof away from the edges of the active regions 4a and 4b. The surfaces of the side walls 18 slopes at an inclination θ (taper angle) to the surface of the silicon dioxide film 17.

Figure 5:
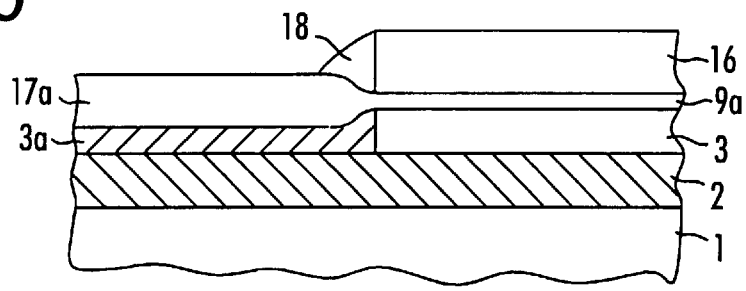

Then, as shown in FIG. 5, thermal oxidation is carried out at temperatures in the range of 800 to 1100 Å using the silicon nitride film 16 and the side walls 18 of silicon nitride as an oxidation mask to form a first LOCOS film 17a. The thickness of the SOI layer 3 (doped region 3a) underlying the LOCOS film 17a is in the range of 300 to 500 Å.

Figure 6:
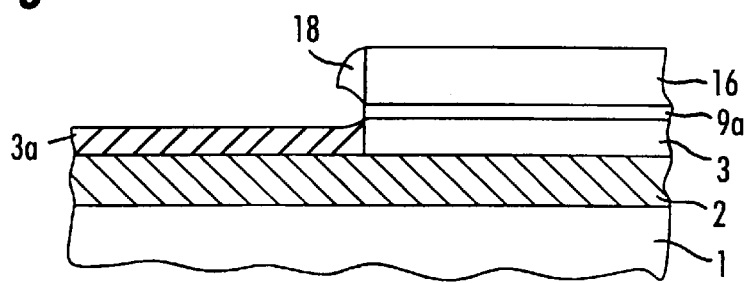

Then, as shown in FIG. 6, portions of the LOCOS film 17a are removed selectively by wet etching. At this stage, a curved concavity of a shape corresponding to a bird's beak of the removed first LOCOS film 17a is formed between the lower surface of the side wall 18 and the surface of a portion of the SOI layer 3 (doped region 3a) under the side wall 18.

Figure 7:
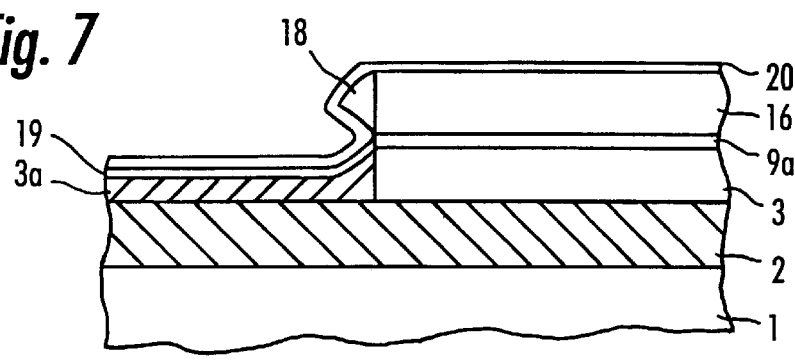

Then, as shown in FIG. 7, the exposed surface of the SOI layer 3 (doped region 3a) is oxidized lightly to form a silicon dioxide film 19 of a thickness in the range of 100 to 200 Å, and then a silicon nitride film 20 of a thickness in the range of 100 to 300 Å is deposited over the entire surface of the structure by CVD, sputtering or the like.

Since the silicon nitride film 20 is created after forming the silicon dioxide film 19, the SOI layer 3 (doped region 3a) is not in contact with the silicon nitride film 20, and hence defects are not liable to develop in the crystal structure in the following oxidation process.

Figure 8:
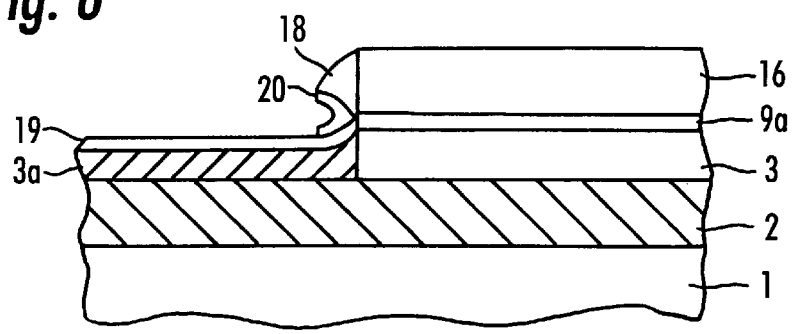

Then, as shown in FIG. 8, the outermost silicon nitride film 20 is etched by anisotropic etching to leave a portion of the silicon nitride film 20 over the surface of the curved concavity. The region in which the element isolating region 8 is formed is covered with the silicon dioxide film 19.

Figure 9:
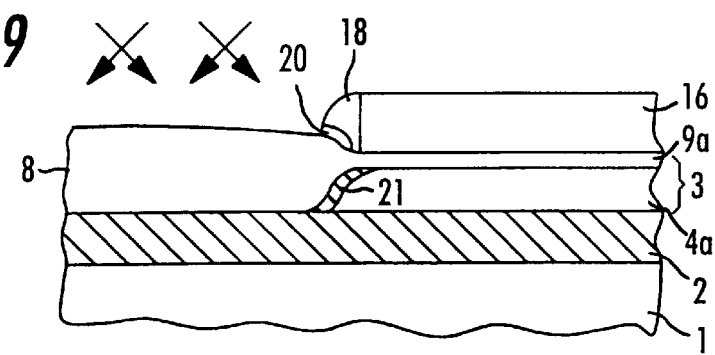

Then, as shown in FIG. 9, the SOI layer 3 is oxidized using the silicon nitride film 16, the side wall 18, and the silicon nitride film 20 as a mask to form a second LOCOS film (element isolating region 8) reaching to the buried oxide film 2. Thus, the element isolating region 8 shown in FIG. 1 (second LOCOS film) is formed, and the active region 4a is formed in a self-aligning mode. Subsequently, boron ions having energy in the range of 20 to 60 keV are implanted in the active region 4a by rotational oblique ion implantation in a dose in the range of $1 \times 10^{13}$ to $15 \times 10^{13}$ ions/cm$^2$ to form a heavily doped region 21. Even if a parasitic transistor is formed in the vicinity of the interface between the active region 4a and the element isolating region 8 by the ion implantation process, the threshold voltage of the parasitic transistor can be increased.

When the doped region 21 is doped in a dose in the range of $2 \times 10^{14}$ to $6 \times 10^{14}$ ions/cm$^2$, which is higher than the dose in the rotational oblique ion implantation for forming the doped region 21 shown in FIG. 9, the process of boron ion implantation for forming the doped region 3a may be omitted. Boron ions implanted in the process of forming the doped region 3a shown in FIG. 3 are absorbed by the oxide film during the oxidizing process, and the boron concentration of a portion of the doped region 3a near the first LOCOS film 17a is reduced. Therefore, it is effective to implant boron ions after oxidation.

Since the element isolating region 8 (second LOCOS film) is formed by oxidation after covering the lower surface of the side wall 18 with the silicon nitride film 20, a bird's beak is formed scarcely, the thickness of the element isolating region 8 is substantially equal to that of the SOI layer 3 that forms the active region 4a, and the step between the adjacent surfaces is reduced to facilitate the following processes.

Figure 10:
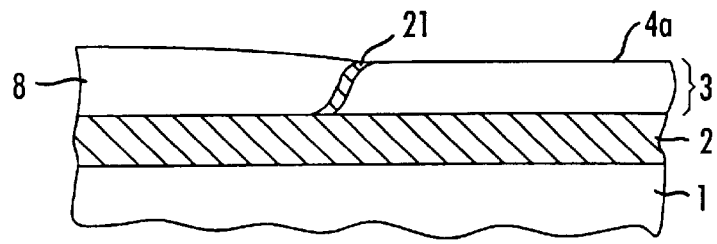

Then, as shown in FIG. 10, the silicon nitride film 16, the side wall 18, and silicon nitride films 20 and further the silicon dioxide film 9a are removed selectively. Then, the surfaces of the active regions 4a and 4b are oxidized or an oxide film is deposited on the surfaces of the active regions 4a and 4b by CVD to form the gate insulating film 9.

Then, as shown in FIG. 1, the gate electrodes 10 of doped polysilicon or the like are formed on the gate insulating film 9. The lightly doped regions 6a and 6b are formed by ion implantation in regions that serve as source/drain regions of LDD structure. Then, side walls 12 are formed using an insulating material on the side surfaces of the gate electrodes 10, and the heavily doped regions 5a and 5b of source/drain regions are formed by ion implantation. The doped region 21 is not disclosed in FIG. 1 to show the lightly doped regions 6a and 6b and the heavily doped regions 5a and 5b of the source/drain regions.

Subsequently, the titanium silicide film 11 is formed on the heavily doped regions 5a and 5b of the source/drain regions and on the gate electrodes 10. Then, the interlayer insulating film 13 is formed over the entire surface of the formed structure, and contact holes 14 are formed in the interlayer insulating film 13 at positions corresponding to the source/drain regions 5a and 5b. Then, the metal conductive leads 15 are formed on the interlayer insulating film 13 so as to fill up the contact holes 14 to complete the semiconductor device shown in FIG. 1.

When manufacturing the semiconductor device, the surface of the SOI layer 3 (doped region 3a) not coated with the silicon nitride film 16 is overetched by dry etching for patterning the silicon nitride film 16 to serve as an etching mask. The step d is formed between the surfaces of the SOI layer 3 near the edge of the silicon nitride film 16 as shown in FIG. 3. Regardless, the surface of the portion of the SOI layer 3 can be leveled off by partly oxidizing the upper surface of the SOI layer 3 by the oxidation process shown in FIG. 4, improving the characteristics of the semiconductor elements.

When the element isolating region (second LOCOS film) 8 is formed, the side wall 18 of silicon nitride is formed on the side surface of the silicon nitride film 16, the silicon nitride film 16 having been formed beforehand on the active regions 4a and 4b. Further, the silicon nitride film 20 is formed so as to cover the surface of the curved concavity formed under the side wall 18, which is a feature of the present invention. Therefore, the growth of a bird's beak can be suppressed in the LOCOS process, and an effective channel width of a design size can be secured. Since the thickness of the second LOCOS film (element isolating region 8) and that of the SOI layer 3 (active regions 4a and 4b) are substantially equal to each other, surface irregularity is reduced and the subsequent processes are facilitated.

Prior to the second LOCOS processing, the silicon nitride film 20 is formed in a smaller concave shape along the surface of the curved concavity under the side wall 18 that serves as a mask for oxidation. The lower portion of the concave shape of the silicon nitride film 20 may be raised by the gradually thickening second LOCOS film during the progress of the second LOCOS process. Therefore, a stress induced in the SOI layer 3 (doped region 3a) and the edge portion of the element isolating region 8 is very small until the curved concavity formed by the silicon nitride film 20 is filled up, and hence defects will not develop in the crystal structure. Consequently, a semiconductor device having satisfactory characteristics can be manufactured.

As shown in FIG. 4, the silicon nitride film 16 of a predetermined thickness is formed over the region for forming the active regions, and the silicon nitride film 18 having a thickness that decreases with distance from the edges of the active regions are formed as a mask for the first LOCOS process. Consequently, an excessive stress is not induced during the LOCOS process, and the bird's beak will not extend into the active region. Further, since the silicon nitride film 20 is formed on the surface of the concave portion of the edge of the mask for the second LOCOS process as shown in FIG. 8, the growth of the bird's beak can be suppressed. Consequently, the effective channel width is not reduced by the LOCOS process, and a semiconductor device of a large-scale integration can be manufactured without leaving useless regions.

Further in the first embodiment, in the step shown in FIG. 7 for forming the semiconductor device, the silicon nitride film 20 is deposited after forming the silicon dioxide film 19 over the surface of the SOI layer 3, so that the silicon nitride film 20 is not in direct contact with the SOI layer 3. Therefore, the deterioration of the film quality of the SOI layer 3 can be suppressed. However, the process of forming the silicon dioxide film 19 may be omitted to simplify the process.

Although the method of manufacturing the semiconductor device has been described in connection with the portion A including the interface between the active region 4a and the element isolating region 8, a semiconductor element having the active region 4b of an opposite conduction type can be formed by implanting an impurity of an opposite conduction type.

Second Embodiment

Figure 11:
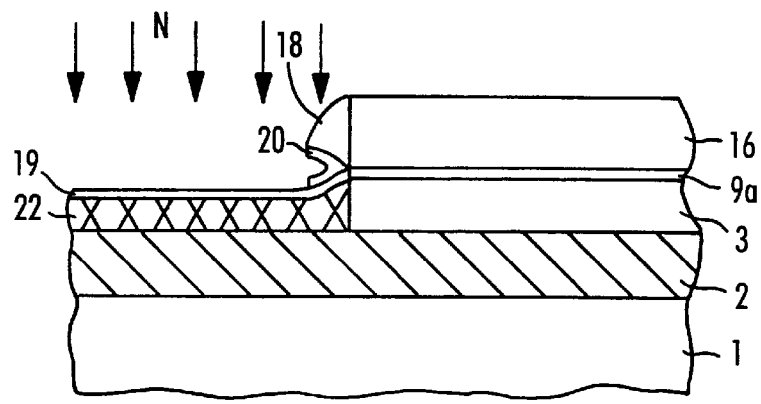
FIG. 11 and FIG. 12 illustrate a method of manufacturing a semiconductor device according to a second embodiment of the present invention.

A method of manufacturing a semiconductor device in a second embodiment according to the present invention is featured by an addition of a step shown in FIG. 11 to the method of manufacturing the semiconductor device in the first embodiment. After the step shown in FIG. 8 for forming the silicon nitride film 20 over the surface of the curved concavity under the side wall 18 has been completed, i.e., before the second LOCOS process for forming the second LOCOS film 8, an additional step of implanting nitrogen ions in the SOI layer 3 in a dose in the range of $1 \times 10^{13}$ to $16 \times 10^{13}$ ions/cm$^2$ to form a nitrogen-implanted region 22 as shown in FIG. 11 is carried out.

Figure 12:
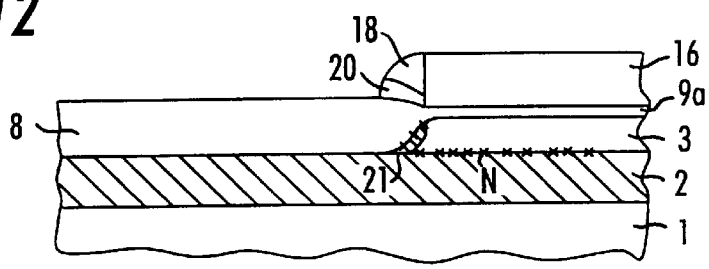

The nitrogen implanted region 22 is formed as shown in FIG. 11 by nitrogen ion implantation under the foregoing conditions, and then the element isolating region (second LOCOS film) 8 is formed as shown in FIG. 12 by thermal oxidation similar to that carried out in the first embodiment. When heated during thermal oxidation, nitrogen implanted in the element isolating region 8 is combined with dangling bonds in the interfaces between the element isolating region 8 and the active region 4a, and between the active region 4a and the buried oxide film 2, and are a accumulated or segregated along those interfaces.

Then, boron ions are implanted into a region in the vicinity of the edge of the SOI layer 3 at a dose in the range of $1 \times 10^{13}$ to $15 \times 10^{13}$ ions/cm$^2$ to form the heavily doped region 21 by a step similar to that shown in FIG. 9 for manufacturing the first embodiment. Thus, a structure shown in FIG. 12 is obtain, in which cross signals indicate segregated nitrogen.

Boron impurity implanted by the boron implantation step as in the first embodiment shown in FIG. 3 diffuses in the second LOCOS process in a diffusing mode substantially the same as that of nitrogen. However, the diffusion coefficient of nitrogen is far greater than that of boron, so that nitrogen diffuses into the interfaces first and combines with the dangling bonds. Accordingly, sites for combination by boron are occupied first by nitrogen, and the diffusion of boron is suppressed.

The condition of the interfaces between the SOI layer 3 and the element isolating region (LOCOS film) 8, and between the SOI layer 3 and the buried oxide film 2 of the semiconductor device in the second embodiment, is improved by the nitrogen accumulated or segregated into those interfaces, whereby the generation of hot carriers can be suppressed, and the TDDB (time dependent dielectric breakdown) characteristic can be improved. Thus, the reliability of the transistors can be improved.

By the nitrogen ion implantation into the SOI layer 3, the portion of the SOI layer 3 comes to have characteristics analogous with silicon nitride. Thereby, the region in which a bird's beak is formed during the LOCOS process becomes difficult to oxidize. Consequently, the growth of a bird's beak can be suppressed, and an effective channel width of a design size can be attained.

Other effects and advantages are provided in the second embodiment in substantially the same way as in the first embodiment.

Third Embodiment

A third embodiment of the present invention will be described hereinafter. A semiconductor device manufacturing method in the third embodiment is capable of manufacturing a semiconductor device having the same effect as that in the first embodiment.

In the semiconductor device manufacturing method for manufacturing the semiconductor device in the first embodiment as previously described, the silicon nitride film 16 is formed in a predetermined pattern to work as the oxidation mask for the LOCOS process. The side surface is substantially perpendicular to the major surface of the silicon wafer 1 as shown in FIG. 3, and the side wall 18 of a silicon nitride film is formed over the vertical side surface of the silicon nitride film 16. As a result, the side surface of the silicon nitride film as a whole is formed to have a slope at the inclination angle θ (taper angle).

In contrast, the third embodiment does not form any side wall corresponding to the side wall 18 of the first embodiment, and forms an oxidation mask having a sloping side surface.

In the following description, parts like or corresponding to those of the first and the second embodiments are designated by the same reference characters.

Figure 13:
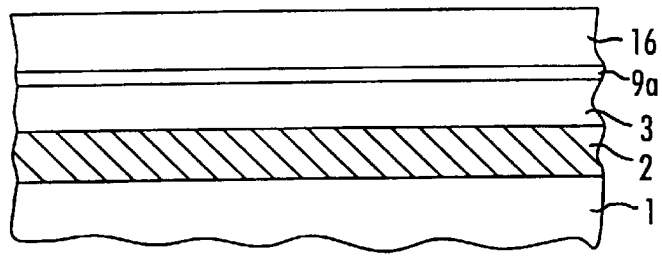
FIG. 13 through FIG. 19 illustrate a method of manufacturing a semiconductor device according to a third embodiment of the present invention.

The semiconductor device manufacturing method in the third embodiment will be described now. Referring to FIG. 13, similar to the step shown in FIG. 2 of the method of manufacturing the first and the second embodiment, an oxide film 9a is formed on a SOI wafer which is created by forming a buried oxide film 2 and a SOI layer 3 on a silicon wafer 1, and a silicon nitride film 16 is formed on the oxide film 9a.

Figure 14:
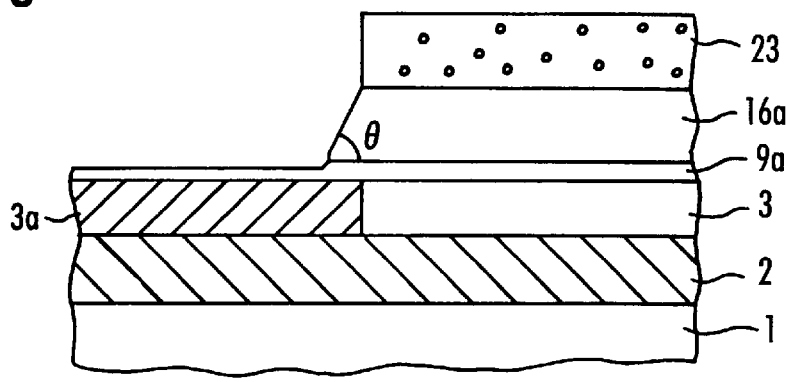

Then, as shown in FIG. 14, a resist film 23 is formed in a pattern conforming to the sizes of active regions 4a and 4b to be formed in the SOI layer 3, and the silicon nitride film 16 is etched by taper etching (dry etching) using the resist film 23 as an etching mask. The silicon dioxide film 9a is used as an etching stopper to form a patterned silicon nitride film 16a having sloping edges sloping at an inclination angle θ in the range of about 40° to about 75°. Then, similar to the method of manufacturing the first embodiment, boron ions are implanted in a region for forming an element isolating region 8 by channel implantation (channel stop implantation) to form a doped region 3a in the SOI layer 3, and the resist film 23 is removed selectively.

As is generally known, a tapered shape is formed by taper etching controlling the quality and quantity of a film deposited on the side surface during etching. Taper etching can be achieved in an atmosphere of a mixed gas containing CHF3, CF4, Ar and such.

The inclination is not limited to angles of 40° to 75°. In some cases, it is more desirable that the inclination is an angle other than those in the range of 45° to 75° depending on the thickness of the silicon nitride film 16a, the thickness of the oxide film 9a underlying the silicon nitride film 16a and the thickness of the buried oxide film.

When the thickness of the edge portion of the silicon nitride film increases as the inclination increases toward 90°, the growth of a bird's beak formed in an end portion of a LOCOS film can be suppressed. In contrast, when the inclination is small, stress that is induced in the LOCOS film and the SOI layer 3 in a LOCOS process is low, so that a semiconductor device having improved characteristics can be manufactured.

Figure 15:
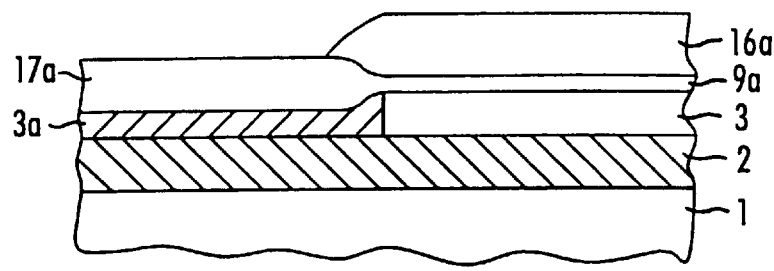

Then, as shown in FIG. 15, a first LOCOS process is carried out to oxidize the surface of the SOI layer 3 in a depth in the range of 400 Å to 600 Å so that the thickness of a portion of the SOI layer 3, in which the element isolating region 8 is to be formed, is reduced to about half the initial thickness of the SOI layer 3, and a LOCOS film 17a of about 1000 Å in thickness is formed.

Figure 16:
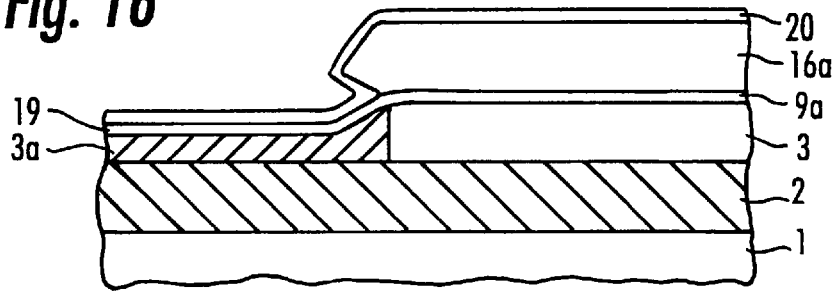

Then, as shown in FIG. 16, a portion of the first LOCOS film 17a is removed by selective wet etching so that a space is formed between the edge of the silicon nitride film 16a and the SOI layer 3 (doped region 3a), and a curved concavity corresponding to that shown in FIG. 6 is formed. Then, at least the exposed surface of the SOI layer 3 (doped region 3a) is oxidized to form a silicon dioxide film 19 of a thickness in the range of 100 Å to 200 Å. Subsequently, a silicon nitride film 20 is deposited over the entire surface of a structure thus formed in a thickness in the range of about 100 Å to about 300 Å.

Similar to the silicon nitride film of the first embodiment, the silicon nitride film 20 has a portion covering the lower surface of the edge of the silicon nitride film 16a, and a portion covering the SOI layer 3 (doped region 3a) separated from the lower surface of the edge of the silicon nitride film 16, and forms a reduced curved concavity.

Figure 17:
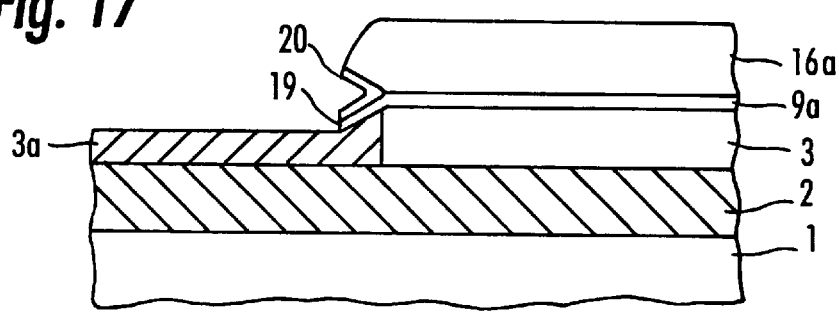

Then, as shown in FIG. 17, the silicon nitride film 20 is removed by anisotropic etching using the SOI layer (doped region 3a) as an etching stopper, leaving a portion of the silicon nitride film 20 covering the surface of the curved concavity. Similar to the first embodiment, the silicon nitride film 20 may be etched, leaving the silicon dioxide film 19.

Figure 18:
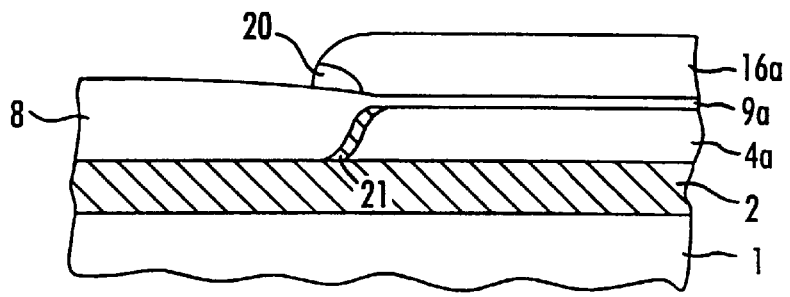

Then, as shown in FIG. 18, a second LOCOS process is carried out to oxidize the exposed surface of the SOI layer (doped region 3a) or the surface of the SOI layer 3 covered with the silicon dioxide film 19 selectively to form a second LOCOS film for forming the element isolating region 8. At this stage, the bottom of the element isolating region 8 is in contact with the buried oxide film 2 to isolate a plurality of active regions 4a and 4b perfectly from each other.

Similar to the method of manufacturing the first embodiment, the impurity concentration of an end portion of the active region 4a is increased by rotational boron ion implantation. Even if a parasitic transistor is formed by the ion implantation, the parasitic transistor is kept in an off state because the threshold of the parasitic transistor is high.

Figure 19:
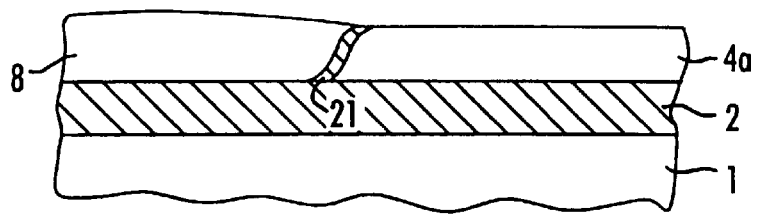

Then, as shown in FIG. 19, the silicon nitride films 16a and 20 and the oxide films 9a and 19, which served as an oxidation mask, are removed selectively, and the active region 4a is processed to construct a FET of a desired construction by the manufacturing method as explained in the first embodiment.

Another semiconductor element can be formed by implanting impurity ions of an opposite conduction type into the active region 4b, and an adjacent element isolating region in the similar way as described above.

The semiconductor device thus manufactured has the same effects as those of the semiconductor device in the first embodiment. Since the silicon nitride film 16a necessary for the LOCOS process is formed so that its edge is sloped at an inclination in the process of fabrication, the side surface of the silicon nitride film 16a need not be covered with a side wall of silicon nitride.

As mentioned above, the element isolating region 8 and the active regions 4a and 4b, having the same effect as those of the element isolating region 8 and the active regions 4a and 4b of the first embodiment, can be formed by using the silicon nitride film 16a which is formed by taper etching as an oxidation mask for LOCOS process.

As mentioned previously in the description of the second embodiment, nitrogen ions may be implanted in the SOI layer 3 before the second LOCOS process to make nitrogen segregate into the inter faces between the active region 4a and the element isolating region 8. Nitrogen ions may also be implanted between the active region 4a and the buried oxide film 2. Thereby, the generation of hot carriers within and in the vicinity of the active region 4a can be suppressed, and the TDDB characteristics can be improved. Naturally, other effects of the third embodiment are the same as those of the first embodiment.

Fourth Embodiment

A fourth embodiment of the present invention will be described hereinafter. The semiconductor device in the first to the third embodiment are featured by the active regions and the element isolating region on an SOI wafer, in which a semiconductor elements is formed. A semiconductor device in the fourth embodiment has active regions and an element isolating region formed on an ordinary silicon wafer. Configuration of the semiconductor device in the fourth embodiment and a method of manufacturing the same will be described.

A method of manufacturing the semiconductor device in the fourth embodiment employs a silicon wafer (bulk semiconductor) instead of the SOI wafer employed in the manufacturing method of the semiconductor device of the first embodiment.

Figure 20:
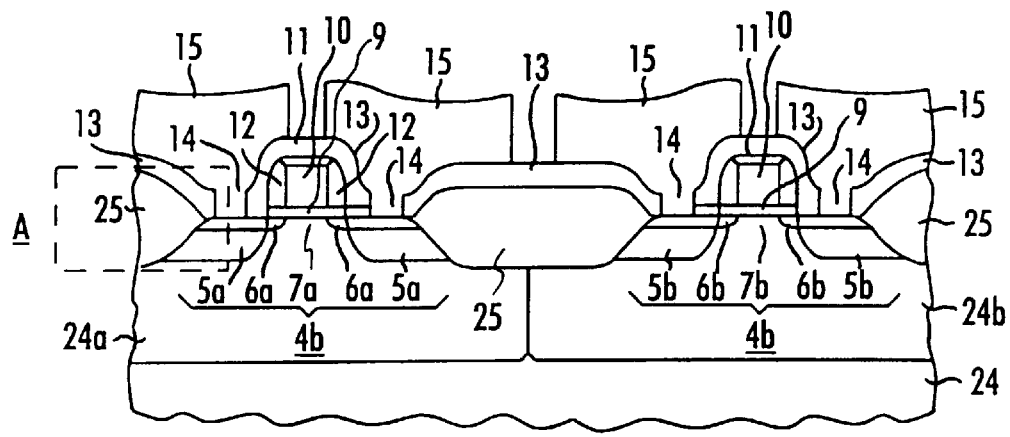
FIG. 20 shows a cross sectional view of a semiconductor device according to a fourth embodiment of the present invention.

FIG. 20 shows a cross-sectional view of a semiconductor device in the fourth embodiment. As shown in FIG. 20, the semiconductor device includes a p-type silicon wafer 24, a p-type well region 24a formed in a predetermined depth in one major surface of the silicon wafer 24 by doping a portion of the silicon wafer 24 with a p-type impurity, and an n-type well region 24b formed in a predetermined depth in the major surface of the p-type silicon wafer 24 by doping a portion of the silicon wafer 24 with an n-type impurity. An element isolating region 25 is formed in the major surface of the silicon wafer 24. In FIG. 20, parts like or corresponding to those of the first to the third embodiment are designated by the same reference characters.

Processes of forming the element isolating region in the manufacturing process of the semiconductor device will be described. A portion A, shown in FIG. 20, including the interface between the element isolating region 25 and an active region 4a, will be illustrated.

Figure 21:
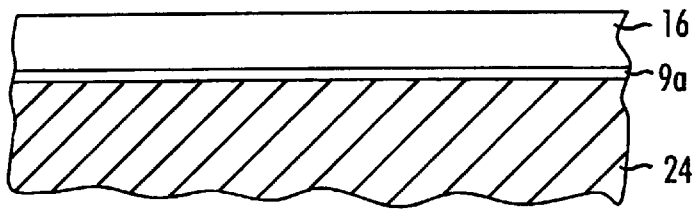
FIG. 21 through FIG. 29 illustrate a method of manufacturing a semiconductor device according to a fourth embodiment of the present invention.

A method of manufacturing the semiconductor device shown in FIG. 20 will be described hereinafter. The p-type well region 24a and the n-type well region 24b are formed in the surface of the silicon wafer 24. Then, as shown in FIG. 21, initial oxidation is performed and a silicon dioxide film 9a is formed on the silicon wafer 241. Then a silicon nitride film 16 is deposited on the silicon dioxide film 9a. The respective thickness of the silicon dioxide film 9a and the silicon nitride film 16 are equal to those of the silicon dioxide film and the silicon nitride film of the first embodiment, respectively. However, the thickness is dependent on the desired characteristics of the semiconductor device.

Figure 22:
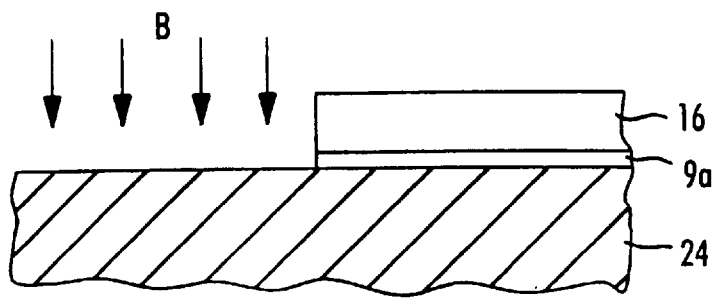

Then, as shown in FIG. 22, a resist pattern, not shown, is formed to cover regions in which active regions are formed. The surface of the structure thus formed is etched by anisotropic etching using the resist film as an etching mask to remove portions of the silicon nitride film 16 and the silicon dioxide film 9a selectively. As a result, portions of the silicon nitride film 16 remain only over the regions in which the active regions are formed. Subsequently, a region in which an element isolating region is formed is implanted with boron as an impurity, using the remaining portions of the silicon nitride film 16 as a mask, and then the resist film is removed selectively.

Figure 23:
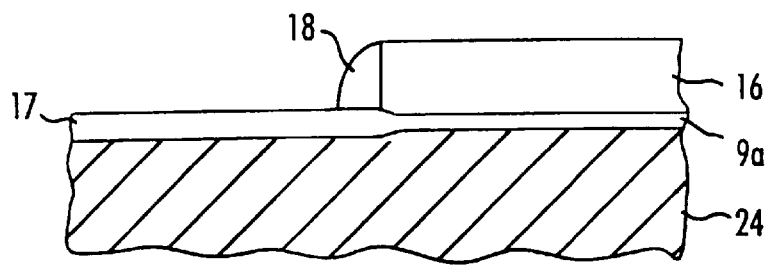

Then, as shown in FIG. 23, the surface of the structure is oxidized using the silicon nitride film 16 as an oxidation mask to form a silicon dioxide film 17 of a thickness equal to that of the silicon dioxide film of the first embodiment.

Subsequently, a silicon nitride film is deposited in a uniform thickness over the structure by CVD, and then the silicon nitride film is etched by anisotropic etching to form a side wall 18 of silicon nitride on the vertical side surface of the silicon nitride film 16.

Figure 24:
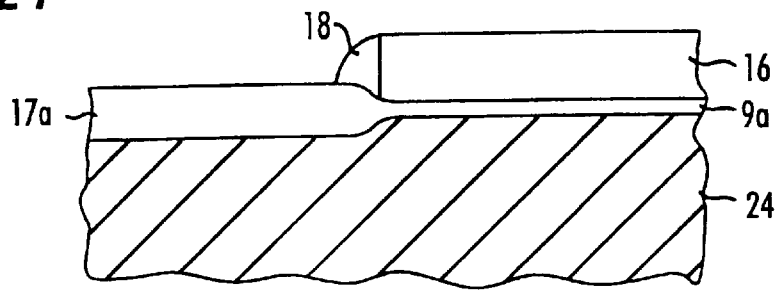

Then, as shown in FIG. 24, a first LOCOS film 17a is formed by a first LOCOS process, using the silicon nitride film 16 and the side wall 18 as an oxidation mask. This is similar to that carried out in manufacturing the first embodiment.

Figure 25:
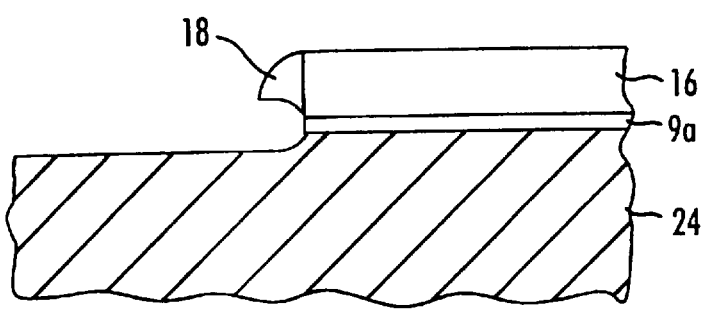

Subsequently, as shown in FIG. 25, the first LOCOS film 17a is removed selectively by wet etching. Consequently, a curved concavity is formed between the lower surface of the side wall 18 and the silicon wafer 24.

Figure 26:
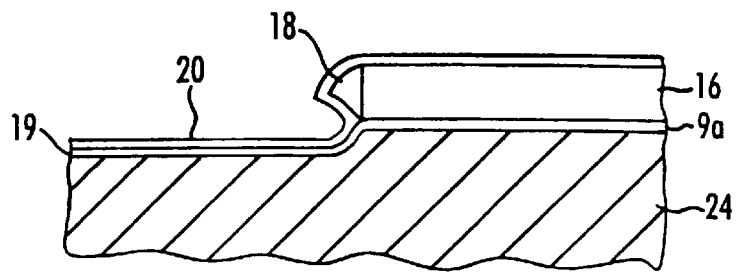

Then, as shown in FIG. 26, the exposed surface of the silicon wafer 24 is oxidized to form a silicon dioxide film 19, and then a silicon nitride film 20 is deposited over the entire surface of the structure. A portion of the silicon nitride film 20 formed on the lower surface of the side wall 18 and a portion of the same, formed on the silicon dioxide film 19, are separated from each other, and a small curved concavity is formed between those portions of the silicon nitride film 20.

Figure 27:
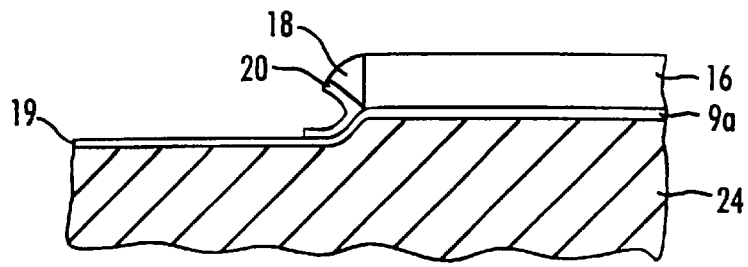

Then, as shown in FIG. 27, a predetermined thickness of the silicon nitride film 20 is removed by anisotropic etching to leave only a portion of the silicon nitride film covering the surface of the curved concavity.

Figure 28:
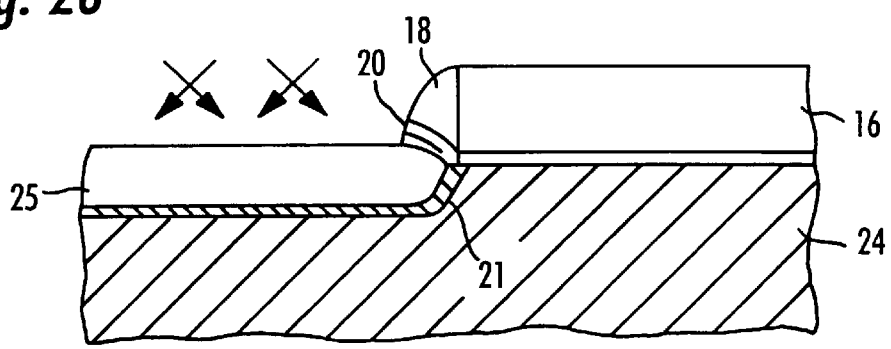

Then, as shown in FIG. 28, a second LOCOS process is carried out, using the silicon nitride films 16 and 20 and the side wall 18 as an oxidation mask to form an element isolating region (second LOCOS film) 25 in the region where the element isolating region 25 is formed. Subsequently, a heavily doped region 21 is formed in the vicinity of the interface between the element isolating region 25 and a portion of the silicon wafer 24, in which an active region is formed, by implanting boron as an impurity by rotational implantation.

Figure 29:
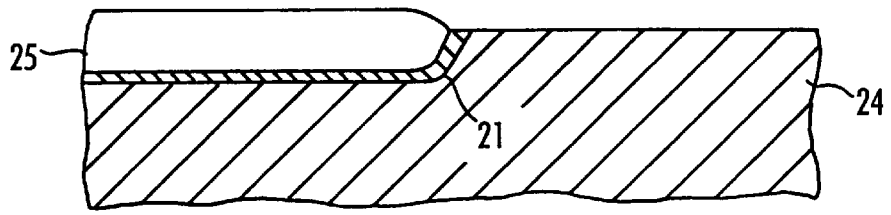

Then, as shown in FIG. 29, the silicon nitride films 16 and 20 and the side wall 18 used as an oxidation mask are removed selectively to form the element isolating region 25 and active regions on the major surface of the silicon wafer 24.

Subsequently, active elements, such as transistors, are formed in the active regions to complete the semiconductor device, for example, as shown in FIG. 20.

Thus, the manufacturing method of a semiconductor device processes the silicon wafer 24 twice for the LOCOS to form the element isolating region 25. The portion of the silicon nitride film 20 remaining, after the removal of the first LOCOS film 17a, on the surface of the curved concavity formed between the side wall 18 and the silicon wafer 24 suppresses the growth of a bird's beak in the second LOCOS process.

Since the silicon nitride film 20 is formed along the surface of the curved concavity, an excessive stress is not induced in portions of the silicon wafer 24 and the element isolating region 25 around the bird's beak, and hence the development of defects in the crystal structure can be suppressed.

Even if a parasitic transistor is formed in the vicinity of the boundary between the element isolating region 25 and the active region, the threshold of the parasitic transistor is high because the element isolating region 25 is implanted twice with the impurity to form the highly doped region 21. Consequently, the conduction of the parasitic transistor is suppressed, so that the malfunction of the semiconductor element can be prevented.

The oxidation mask is created by forming the silicon nitride film 16 in the same size as the active region, and forming the side wall 18 on the side surface of the silicon nitride film 16. Therefore, the growth of the bird's beak into the active region can be suppressed. Thus, a large effective channel region (active region) can be formed, and hence a higher integration of a semiconductor device is achieved.

Fifth Embodiment

A semiconductor device in a fifth embodiment will be described hereinafter. In the semiconductor device in the fourth embodiment, the element isolating region 25 is formed on the silicon wafer 24. In the fifth embodiment, an element isolating region 25 is formed in a silicon wafer 24 different from that of the fourth embodiment.

A semiconductor device manufactured in the fifth embodiment is similar in construction to that shown in FIG. 20, and is manufactured on a silicon wafer instead of a SOI wafer. The fifth embodiment employs the technique used in the second embodiment to make nitrogen segregate into the boundary between the active region and the inactive region (element isolating region).

Figure 30:
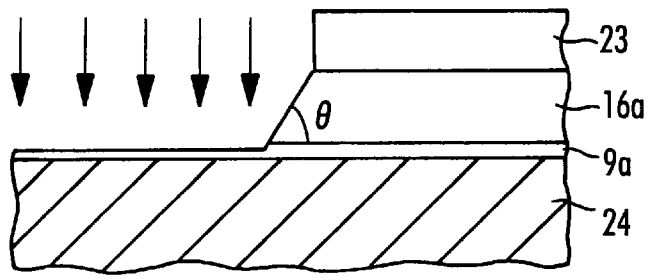
FIG. 30 through FIG. 34 illustrate a method of manufacturing a semiconductor device according to a fifth embodiment of the present invention.

Referring first to FIG. 30, one major surface of a silicon wafer 24 is oxidized to form a silicon dioxide film 9a, and a silicon nitride film 16a is deposited in a uniform thickness over the entire surface of the formed structure. Then, a resist pattern 23 is formed to cover a portion of the silicon nitride film 16a corresponding to an active region. Then, the silicon nitride film 16a is etched by taper etching, using the resist film 23 as an etching mask, so that the thickness of the edge portion of the silicon nitride film 16a extending outward from the edge portion of the active region decreases as it extends outwardly from the edge of the active region.

Thus, the edge portion of the silicon nitride film 16a slopes at a predetermined inclination angle θ (taper angle) to the major surface of the silicon wafer 24. With the resist film 23 covering the silicon nitride film 16a on the active region, the element isolating region is implanted with an impurity, and then the resist film 23 is removed.

Figure 31:
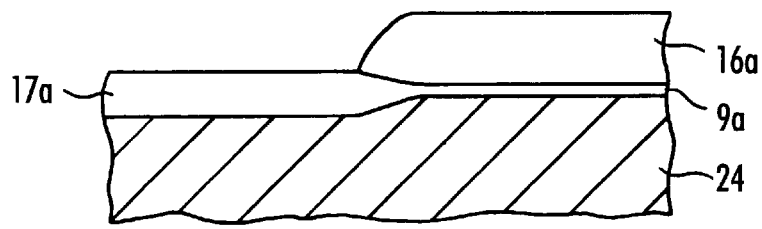

Then, as shown in FIG. 31, a first LOCOS film 17a is formed by a first LOCOS process using the silicon nitride film 16a as an oxidation mask.

Figure 32:
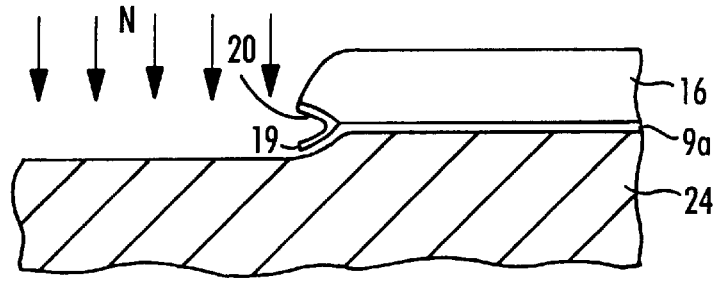

Then, as shown in FIG. 32, portions of the first LOCOS film 17a are removed selectively, and the exposed surface of the silicon wafer 24 is oxidized to form a silicon dioxide film 19. Then, a silicon nitride film 20 is deposited over the entire surface of the structure.

Subsequently, anisotropic etching, similar to that used in manufacturing the semiconductor device in the third embodiment, is carried out so that a portion of the silicon nitride film 20 remains on the surface of a concavity formed in the edge of the silicon nitride film 16a by a bird's beak of the first LOCOS film 17a. The silicon dioxide film 19 may be left in regions other than the surface of the concavity.

Then, nitrogen ions are implanted in a region in which an element isolating region is formed.

Figure 33:
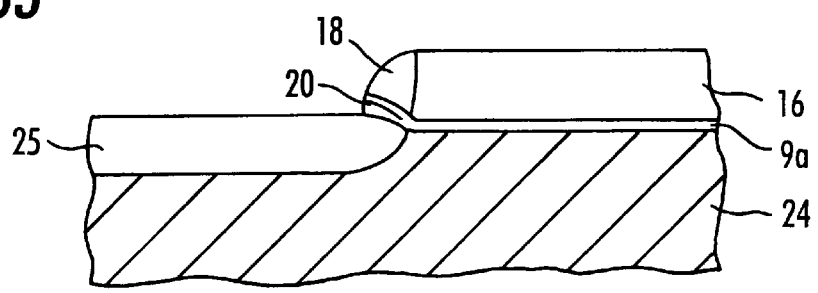

Then, as shown in FIG. 33, a second LOCOS process is carried out forming an element isolating region (second LOCOS film) 25.

Figure 34:
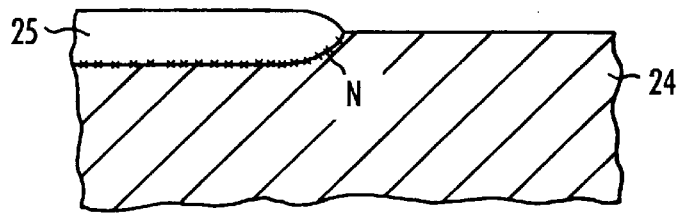
Figure 35:
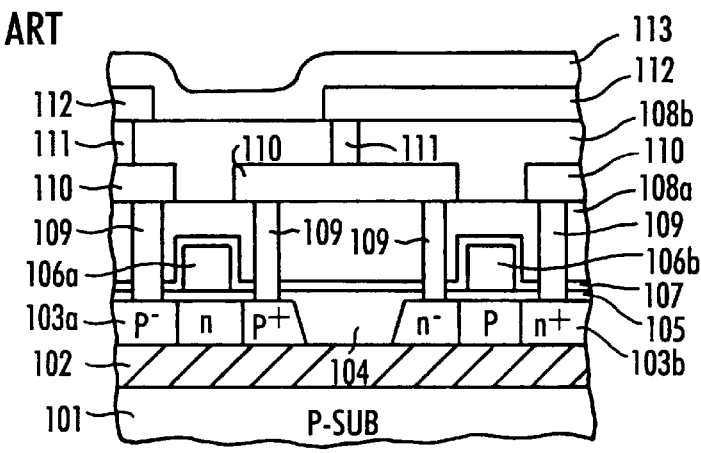
FIG. 35 shows a sectional view of a conventional semiconductor device.
Figure 36:
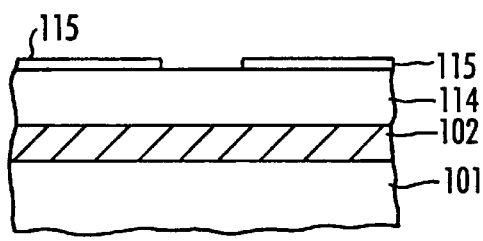
FIG. 36 through FIG. 43 illustrate a conventional method of manufacturing a semiconductor device.
Figure 37:
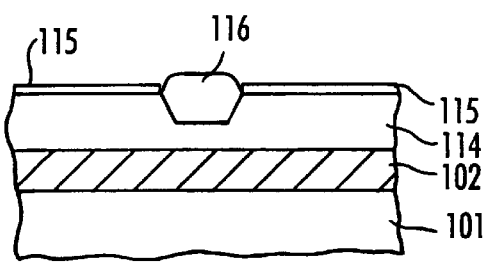
Figure 38:
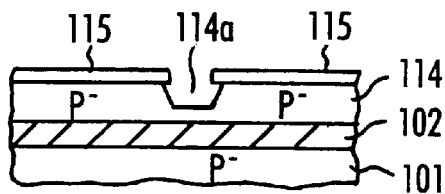
Figure 39:
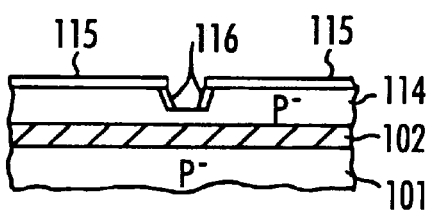
Figure 40:
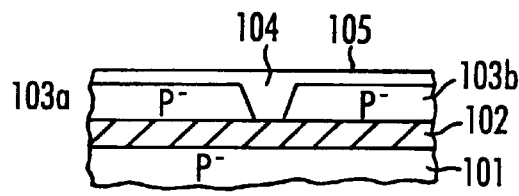
Figure 41:
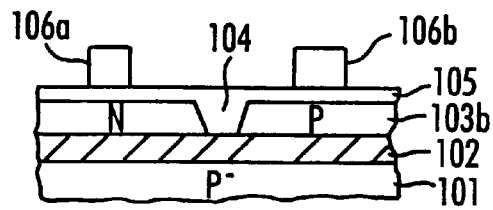
Figure 42:
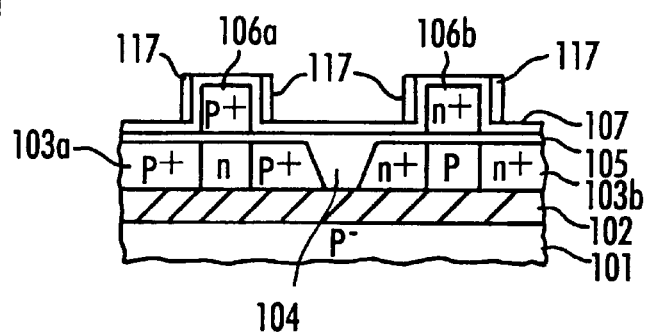
Figure 43:
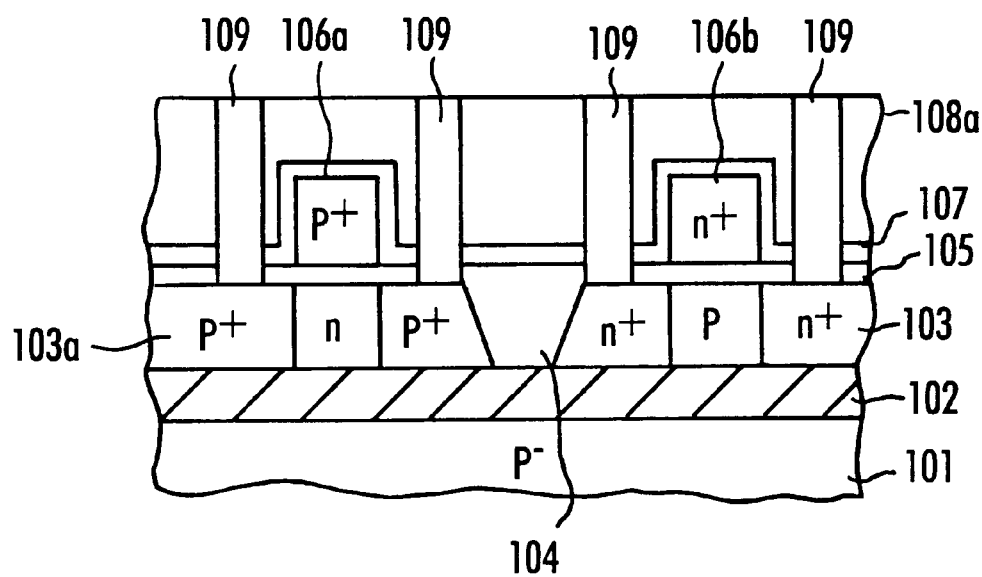

Subsequently, the silicon nitride films 16a and 20, a side wall 18 and the silicon dioxide film 9a are removed selectively to form the element isolating region 25 as shown in FIG. 34, in which cross signals indicate segregated nitrogen. The nitrogen, implanted in the process shown in FIG. 32, accumulate or segregate by heat treatment at the time of the second LOCOS oxidation. The accumulation or segregation occurs around the interface between the element isolation region 25 and the active region, and around the interface between the element isolation region 25 and the silicon substrate 24.

The silicon nitride film 16a is taper-etched so that its edge portion slopes at the inclination angle θ to the major surface of the silicon wafer 24. Accordingly, an excessive stress will not be induced in the vicinity of the edge portion of the silicon nitride film 16a during the LOCOS process.

Nitrogen segregates into the vicinity of the interface between the element isolating region 25 and a region in which an active region is formed. Thereby, a semiconductor element of satisfactory characteristics can be formed in the active region. Further, nitrogen remains in a region where a bird's beak is formed, so that the region comes to have characteristics similar to silicon nitride film which is hard to oxidize. Thus, the growth of the bird's beak can be suppressed.

Naturally, the nitrogen implanting process that is carried out prior to the second LOCOS process can be applied to the manufacturing method of the semiconductor device in the fourth embodiment, and the same effects are obtained as those available from the fifth embodiment.

As has been explained in detail as above, the present invention provides merits and advantages as follows. First, in the semiconductor device in accordance with the present invention having the active regions formed on the SOI wafer, nitrogen segregates at least into the interfaces between the active regions and the element isolating region or in the interfaces between the active regions and the buried oxide film, or in both interfaces. Consequently, the growth of a bird's beak that develops when the element isolating region is subjected to the LOCOS process can be suppressed, whereby an effective area available for forming the active regions can be secured. Further, the condition of the interfaces between the SOI layer (active regions) and the oxide film (the element isolating region and the buried oxide film) can be improved, and transistors with improved reliability can be formed.

Further, in the semiconductor device in accordance with the present invention having the active regions formed on the silicon wafer, nitrogen segregates into the interfaces between the element isolating region formed on the surface of the silicon wafer and the active regions which are not oxidized. Consequently, the growth of a bird's beak that develops when the element isolating region is subjected to the LOCOS process can be suppressed, whereby an effective area available for forming the active regions can be secured. In addition, the condition of the interfaces between the silicon wafer, in which the active regions are formed, and the oxide film (the element isolating region), can be improved, and transistors with improved reliability can be formed.

According to the present invention, the thickness of the edge portion of the silicon nitride film, that serves as an oxidation mask in the LOCOS process for forming the element isolating region on the SOI wafer, is decreased toward the edge. Therefore, stress induced in the SOI layer by a bird's beak can be relaxed, so that the development of defects in the crystal structure can be suppressed.

Further, in the manufacturing process, the LOCOS film of a relatively small thickness is formed by the first LOCOS process, and the LOCOS film is removed. Then, the surface of the concavity formed between the SOI layer and the oxidation mask is coated with the silicon nitride film, and then the second LOCOS process is carried out. Thereby, the growth of a bird's beak of the element isolating region (the second LOCOS film) in the second LOCOS process can be suppressed, and hence the active regions can be formed in a design size.

Further, according to the present invention, the second LOCOS film for forming the element isolating region on the SOI wafer is formed in contact with the buried oxide film. Therefore, the active regions formed on the SOI layer can be electrically isolated perfectly from each other.

Further, according to the present invention, nitrogen is implanted in a region in which the element isolating region is formed before forming the second LOCOS film for the element isolating region on the SOI wafer. The nitrogen, thus implanted, segregates into the interfaces between the second LOCOS film and the active regions, and between the buried oxide film and the active regions. The nitrogen combines with dangling bonds in the interfaces to improve the condition of the interfaces. Nitrogen implanted into the SOI layer adds characteristics similar with a silicon nitride film, whereby the growth of a bird's beak into the end portion of the element isolating region can be suppressed. Consequently, the active regions can be formed in a design size increasing the effective area available for forming the active regions, and higher integration can be achieved.

Further, by the additional process for implanting impurity ions into the second LOCOS film by rotational implantation, the heavily doped region is formed in the vicinity of the interface between the second LOCOS film (the element isolating region) and the active region, and in an adjacent portion of the active region. Therefore, even if a parasitic transistor is formed in the active region, the threshold of the parasitic transistor is high, and hence the parasitic transistor can be kept in an off state.

Further, when the element isolating region is formed on one major surface of the silicon wafer, similarly in the case of the SOI wafer, the first LOCOS film formed by the first LOCOS process is removed. Then, the silicon nitride film is deposited on the surface of the concavity between the silicon nitride film serving as a mask, and the silicon wafer. Afterwards, silicon nitride film is used as an oxidation mask. Therefore, the growth of a bird's beak of the second LOCOS film formed by the second LOCOS process can be suppressed, and the effective active regions can be enlarged. Since the edge portion of the silicon nitride film serving as an oxidation mask is tapered toward the edge, the development of defects in the crystal structure in regions around the edge portion of the silicon nitride film due to stress can be suppressed.

Further, in forming the element isolating region either on the SOI wafer or on the silicon wafer, the silicon nitride film used as an oxidation mask in the first LOCOS process is formed over the entire surface of the wafer, and is patterned by ordinary anisotropic etching in the dimensions of the active regions. The side wall of a silicon nitride film is then formed on the vertical side surface of the silicon nitride film. The use of the silicon nitride film as an oxidation mask prevents the reduction of the active regions due to the LOCOS process, and enables the active regions to be formed in a design size.

Finally, in forming the element isolating region either on the SOI wafer or on the silicon wafer, the silicon nitride film used as an oxidation mask in the first LOCOS process is formed over the entire surface of the wafer, and is etched by taper etching using a resist film patterned in the dimensions of the active regions as an etching mask. Thereby, the silicon nitride film has edge portions of a relatively small thickness and center portions of a relatively large thickness corresponding to the active regions. The use of the formed silicon nitride film as an oxidation mask prevents the reduction of the active regions due to the LOCOS process, and enables the active regions to form in a design size.

Obviously, numerous additional modifications and variations of the present invention are possible in light of the above teachings. It is therefore to be understood that within the scope of the appended claims, the invention may be practiced otherwise than as specifically described herein.

What is claimed is:

1. A manufacturing method of a semiconductor device comprising the steps of:

forming a first silicon nitride film on a first oxide film which is formed on one major surface of a SOI wafer, said SOI wafer formed by forming a SOI layer on a buried oxide film which is formed on a silicon wafer, a portion of said first silicon nitride film on an active region in said SOI layer having a predetermined thickness and a portion of said first silicon nitride film extending outward from an edge of said active regions decreasing in thickness as said nitride film extends outward from said edge of said active region;

patterning said first silicon nitride film;

forming a first LOCOS film using said first silicon nitride film as an oxidation mask;

forming a concavity between an edge of said first silicon nitride film and said SOI layer by selectively removing said first LOCOS film;

forming a second oxide film on said surface of said SOI layer;

forming a second silicon nitride film over said entire surface of said SOI wafer including said surface of said concavity;

removing said second silicon nitride film by anisotropic etching leaving a portion of said second silicon nitride film formed on said surface of said concavity;

forming a second LOCOS film using said first and said second silicon nitride film as an oxidation mask; and removing said first and said second silicon nitride film.

2. A manufacturing method of a semiconductor device according to claim 1, wherein a bottom portion of said second LOCOS film is formed in contact with said buried oxide film.

3. A manufacturing method of a semiconductor device according to claim 2, further comprising the steps of:

implanting nitrogen into a region of said SOI layer where an element isolating region is formed prior to said step of forming a second LOCOS film, wherein said nitrogen is caused to accumulate at interfaces between said element isolating region of said second LOCOS film and said active region or at interfaces between said active region and said buried oxide film by heating in said step of forming a second LOCOS film.

4. A manufacturing method of a semiconductor device according to claim 1, further comprising the steps of:

rotationally implanting impurity ions to form a doped region of a high impurity density in a vicinity of the interface between said element isolating region and said active region after said step of forming said second LOCOS film.

5. A manufacturing method of a semiconductor device according to claim 1, wherein said step of forming said first silicon nitride film includes the steps of:

forming a silicon nitride film having a predetermined thickness over said active region with an end surfaces thereof perpendicular to one major surface of said SOI wafer on the edge of said active region;

forming an oxide film on the major surface of said SOI wafer in a region corresponding to an element isolating region; and forming a silicon nitride side wall on said end surface of said silicon nitride film.

6. A manufacturing method of a semiconductor device according to claim 1, wherein said step of forming said first silicon nitride film includes the steps of:

forming a silicon nitride film of a predetermined thickness on one major surface of said SOI wafer;

forming an etching mask on said silicon nitride film over said region corresponding to said active region; and etching said silicon nitride film by taper etching using said etching mask so that said end portion of said silicon nitride film slopes at a predetermined inclination to said major surface of said SOI wafer.

7. A manufacturing method of a semiconductor device comprising the steps of:

forming a first silicon nitride film on a first oxide film formed on one major surface of a silicon wafer, a portion of said first silicon nitride film covering an active region in said silicon wafer having a predetermined thickness and a portion of said first silicon nitride film extending outward from an edge of said active region has a thickness which decreases as it extends outwardly from said edge of said active region;

patterning said first silicon nitride film;

forming a first LOCOS film using said first silicon nitride film as an oxidation mask;

forming a concavity between an edge of said first silicon nitride film and said silicon wafer by selectively removing said first LOCOS film;

forming a second oxide film on said surface of said silicon wafer, and forming a second silicon nitride film over said entire surface of said silicon wafer including said surface of said concavity;

removing said second silicon nitride film by anisotropic etching leaving a portion of said second silicon nitride film formed on said surface of said concavity;

forming a second LOCOS film using said first and said second silicon nitride film as an oxidation mask; and removing said first and said second silicon nitride film.

8. A manufacturing method of a semiconductor device according to claim 7, further comprising the steps of:

implanting nitrogen into a region of said semiconductor layer where an element isolating region is formed prior to said step of forming a second LOCOS film, wherein said nitrogen is caused to accumulate at least at the interface between said element isolating region of said second LOCOS film and said active region by heating in said step of forming a second LOCOS film.

9. A manufacturing method of a semiconductor device according to claim 7, further comprising the steps of:

rotationally implanting impurity ions to form a doped region of a high impurity density in the vicinity of said interface between said element isolating region and said active region after said step of forming said second LOCOS film.

10. A manufacturing method of a semiconductor device according to claim 9, wherein said step of forming said first silicon nitride film includes the steps of:

forming a silicon nitride film having a predetermined thickness over said active region with an end surfaces thereof perpendicular to one major surface of said silicon wafer on said edge of said active region;

forming an oxide film on a major surface of said silicon wafer in a region corresponding to an element isolating region; and forming a silicon nitride side wall on said end surface of said silicon nitride film.

11. A manufacturing method of a semiconductor device according to claim 9, wherein said step of forming said first silicon nitride film includes the steps of:

forming a silicon nitride film of a predetermined thickness on one major surface of said silicon wafer;

forming an etching mask on said silicon nitride film over said region corresponding to said active region; and etching said silicon nitride film by taper etching using said etching mask so that said end portion of said silicon nitride film slopes at a predetermined inclination to said major surface of said silicon wafer.

* * * * *